(12) United States Patent
Kim

(10) Patent No.: US 8,089,320 B2
(45) Date of Patent: Jan. 3, 2012

(54) DIFFERENTIAL AMPLIFIER AND OSCILLATOR

(75) Inventor: Chan-kyung Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 115 days.

(21) Appl. No.: 12/684,332

(22) Filed: Jan. 8, 2010

(65) Prior Publication Data

US 2010/0171561 A1 Jul. 8, 2010

(30) Foreign Application Priority Data

Jan. 8, 2009 (KR) ........................ 10-2009-0001523

(51) Int. Cl.
*H03B 27/00* (2006.01)
(52) U.S. Cl. ............. 331/57; 331/34; 327/266; 327/274
(58) Field of Classification Search .................... 331/57, 331/34; 327/266, 274
See application file for complete search history.

(56) References Cited

U.S. PATENT DOCUMENTS

| 5,426,398 A | 6/1995 | Kuo |
| 5,896,069 A | 4/1999 | Williams et al. |
| 7,911,282 B2 * | 3/2011 | Fujino ............................ 331/57 |

FOREIGN PATENT DOCUMENTS

| KR | 20-0323692 | 8/2003 |
| KR | 100842404 | 6/2008 |

\* cited by examiner

*Primary Examiner* — Arnold Kinkead
(74) *Attorney, Agent, or Firm* — Harness, Dickey & Pierce

(57) ABSTRACT

In one embodiment, the differential amplifier (DA) includes a first inverter inverting a first input signal and outputting the inverted first input signal to a current supply controller and a current drain controller. A second inverter inverts the first input signal and outputs the inverted first input signal as an output signal of the DA. The current supply controller supplies current to the first and second inverters in response to the inverted first input signal output from the first inverter during a first period. The current drain controller drains current from the first and second inverters in response to the inverted first input signal output from the first inverter during a second period. The output signal of the DA and the first input signal have differential phases with respect to each other and oscillate between logic high and low levels during the first period and the second period.

7 Claims, 9 Drawing Sheets

DIFFERENTIAL AMPLIFIER AND OSCILLATOR

CROSS-REFERENCE TO RELATED APPLICATION

This application claims priority under 35 U.S.C. §119 to Korean Patent Application No. 10-2009-0001523, filed on Jan. 8, 2009, in the Korean Intellectual Property Office, the disclosure of which is incorporated by reference herein in its entirety.

BACKGROUND

1. Technical Field

The inventive concept relates to an oscillator, and more particularly, to an oscillator including a plurality of complementary differential amplifiers.

2. Discussion of the Related Art

A phase locked loop (PLL) is a control system that generates a signal that has a fixed relation to the phase of a "reference" signal. An analog PLL includes a phase detector, a low pass filter and a voltage-controlled oscillator (VCO) placed in a negative feedback closed-loop configuration, for example. The VCO, which creates an output frequency of the PLL, is an important element for determining the performance of the PLL.

In semiconductor devices, multi-phase clocks may be used to obtain a high bandwidth. The VCO may generate multi-phase clocks, which have constant intervals, by varying its output frequency according to a control voltage. A VCO that functions as a multi-phase clock generator is configured with a separate divider or pull-swing converter to stabilize the clocks, for example.

Accordingly, there exists a need for a VCO that can stably generate multi-phase clocks by itself.

SUMMARY

According to an exemplary embodiment of the inventive concept, there is provided oscillator including: a first complementary differential amplifier (CDA) outputting a first output signal obtained by amplifying signals input to a first input terminal and a second input terminal of the first CDA, wherein the amplified version of the signal input to the second input terminal of the first CDA is the first output signal, and wherein the amplification of the signal input to the second input terminal of the first CDA is controlled in response to the amplified version of the signal input to the first input terminal of the first CDA; and a second CDA outputting a second output signal obtained by amplifying signals input to a first input terminal and a second input terminal of the second CDA, the second output signal having a differential phase with respect to the first output signal, wherein the amplified version of the signal input to the second input terminal of the second CDA is the second output signal, and wherein the amplification of the signal input to the second input terminal of the second CDA is controlled in response to the amplified version of the signal input to the first input terminal of the second CDA, and wherein the first CDA includes an output terminal connected to the first input terminal and the second input terminal of the second CDA, and the second CDA includes an output terminal connected to the first input terminal and the second input terminal of the first CDA.

The first CDA and the second CDA may include the same structures or the same amplification capabilities.

The first CDA may include: a first inverter inverting the second output signal and outputting the inverted second output signal; a second inverter inverting the second output signal and outputting the inverted second output signal as the first output signal; a first current supply controller selectively supplying a first current to the first inverter and the second inverter in response to the inverted second output signal output from the first inverter; and a first current drain controller selectively draining a second current from the first inverter and the second inverter in response to the inverted second output signal output from the first inverter, and wherein the second CDA includes: a third inverter inverting the first output signal and outputting the inverted first output signal; a fourth inverter inverting the first output signal and outputting the inverted first output signal as the second output signal; a second current supply controller selectively supplying a third current to the third inverter and the fourth inverter in response to the inverted first output signal output from the third inverter; and a second current drain controller selectively draining a fourth current from the third inverter and the fourth inverter in response to the inverted first output signal output from the third inverter.

The first current supply controller and the second current supply controller have the same structures or same current supply capabilities, the first current drain controller and the second current drain controller have the same structures or same current drain capabilities, and the first through fourth inverters have the same structures or same device drive capabilities.

The first current supply controller comprises a first switch which responds to the inverted second output signal output from the first inverter and connects or blocks a first voltage to/from the first inverter and the second inverter, thereby supplying or blocking the first current to/from the first inverter and the second inverter, the first current drain controller comprises a second switch which responds to the inverted second output signal output from the first inverter and connects or blocks a second voltage to/from the first inverter and the second inverter, thereby selectively draining the second current from the first inverter and second inverter, the second current supply controller comprises a third switch which responds to the inverted first output signal output from the third inverter and connects or blocks the first voltage to/from the third inverter and the fourth inverter, thereby supplying or blocking the third current to/from the third inverter and the fourth inverter, and the second current drain controller comprises a fourth switch which responds to the inverted first output signal output from the third inverter and connects or blocks the second voltage to/from the third inverter and the fourth inverter, thereby selectively draining the fourth current from the third inverter and the fourth inverter.

The first inverter comprises a first transistor and a second transistor which are connected to each other in series, the first transistor and the second transistor each comprising a gate to which the second output signal is applied, the second inverter comprises a third transistor and a fourth transistor which are connected to each other in series, the third transistor and the fourth transistor each comprising a gate to which the second output signal is applied, the third inverter comprises a fifth transistor and a sixth transistor which are connected to each other in series, the fifth transistor and the sixth transistor each comprising a gate to which the first output signal is applied, and the fourth inverter comprises a seventh transistor and an eighth transistor, the seventh transistor and the eighth transistor each comprising a gate to which the first output signal is applied.

The oscillator is part of a voltage controlled oscillator in a phase locked loop.

The oscillator is part of a memory controller in a memory device.

According to an exemplary embodiment of the inventive concept, there is provided an oscillator including: first through $n^{th}$ oscillator cells, wherein n is a natural number, wherein each oscillator cell includes a first CDA outputting a first output signal obtained by amplifying signals input to a first input terminal and a second input terminal of the first CDA, wherein the amplified version of the signal input to the second input terminal of the first CDA is the first output signal, and wherein the amplification of the signal input to the second input terminal of the first CDA is controlled in response to the amplified version of the signal input to the first input terminal of the first CDA; a second CDA outputting a second output signal obtained by amplifying signals input to a first input terminal and a second input terminal of the second CDA, the second output signal having a differential phase with respect to the first output signal, wherein the amplified version of the signal input to the second input terminal of the second CDA is the second output signal, and wherein the amplification of the signal input to the second input terminal of the second CDA is controlled in response to the amplified version of the signal input to the first input terminal of the second CDA; a first auxiliary inverter inverting the second output signal and outputting the inverted second output signal; and a second auxiliary inverter inverting the first output signal and outputting the inverted first output signal, wherein the first CDA includes an output terminal connected to the first input terminal and the second input terminal of the second CDA and the second CDA includes an output terminal connected to the first input terminal and the second input terminal of the first CDA, wherein the first auxiliary inverter and the second auxiliary inverter of an $i^{th}$ oscillator cell (i is greater or equal to 1 and less than or equal to n−1) are connected to an $(i+1)^{th}$ oscillator cell using direct-coupling, and wherein the first auxiliary inverter and the second auxiliary inverter of the $(i+1)^{th}$ oscillator cell are connected to the $i^{th}$ oscillator cell using cross-coupling.

A phase difference between the first and second output signals of the $i^{th}$ oscillator cell and the first and second output signals of the $(i+1)^{th}$ oscillator cell is changed by adjusting an amount of a control voltage applied to each of the $i^{th}$ oscillator cell and the $(i+1)^{th}$ oscillator cell.

According to an exemplary embodiment of the inventive concept, there is provided an DA, comprising: a first inverter; a second inverter; a current supply controller; and a current drain controller, wherein the first inverter inverts a first input signal applied to the first inverter and outputs the inverted first input signal to the current supply controller and the current drain controller, wherein second inverter inverts the first input signal applied to the second inverter and outputs the inverted first input signal as an output signal of the DA, wherein the currently supply controller supplies a first current to the first and second inverters in response to the inverted first input signal output from the first inverter during a first period, wherein the current drain controller drains a second current from the first and second inverters in response to the inverted first input signal output from the first inverter during a second period, and wherein the output signal of the DA and the first input signal have differential phases with respect to each other and oscillate between logic high and low levels during the first period and the second period.

The oscillation frequency is adjusted by a control voltage applied to the DA.

The current supply controller and the current drain controller comprise a PMOS and NMOS transistor, respectively.

The first inverter comprises a PMOS and NMOS transistor and the second inverter comprises a PMOS and NMOS transistor.

The output of the DA is an input signal to another DA having the same structure as the original DA, and wherein the first input signal of the original DA is an output signal of the another DA.

The current supply controller does not supply current to the first and second inverters in response to the inverted first input signal output from the first inverter during the second period and the current drain controller does not drain current from the first and second inverters in response to the inverted first input signal output from the first inverter during the first period.

BRIEF DESCRIPTION OF THE DRAWINGS

The above and other features of the inventive concept will become more apparent by describing in detail exemplary embodiments thereof with reference to the accompanying drawings in which.

DETAILED DESCRIPTION OF THE EMBODIMENTS

Figure 1A:
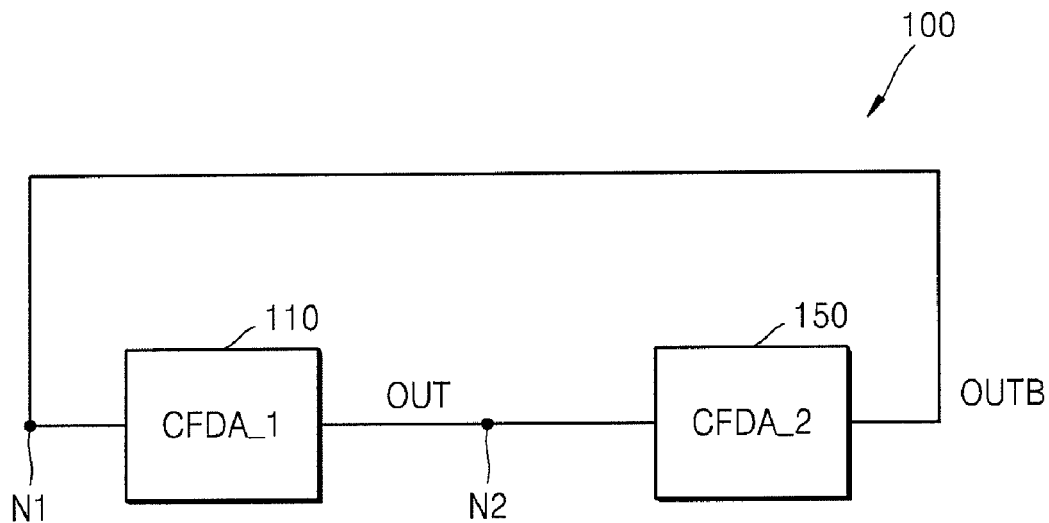
FIG. 1A is a block diagram of an oscillator according to an exemplary embodiment of the inventive concept.

Exemplary embodiments of the inventive concept are described more fully hereinafter with reference to the accompanying drawings. In the drawings, like reference numerals denote like elements.

Figure 1B:
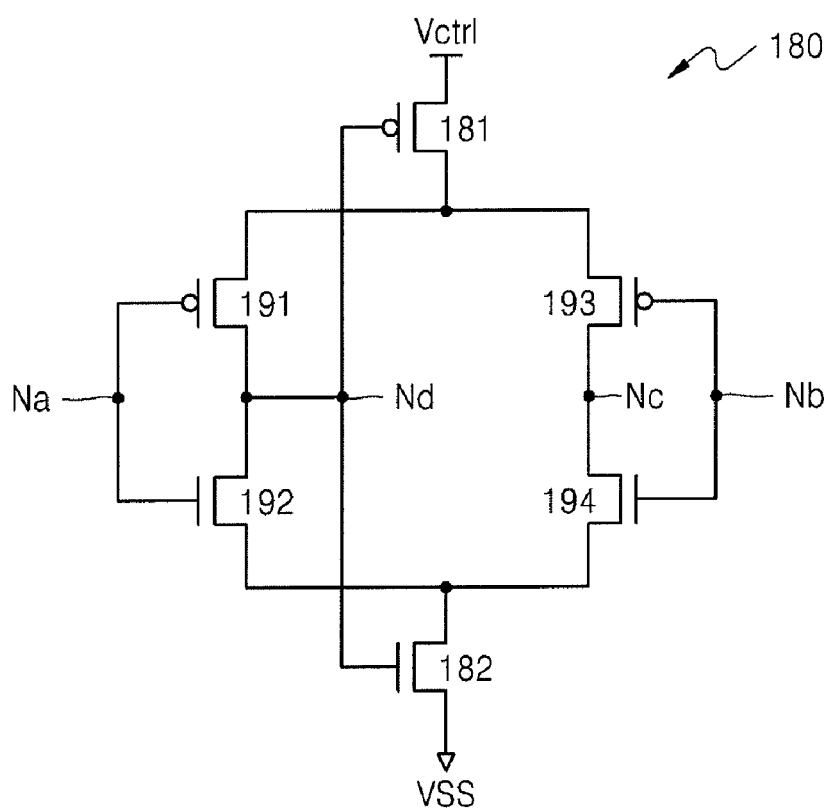
FIG. 1B is a circuit diagram of a complementary differential amplifier (CDA) of the oscillator of FIG. 1A.

FIG. 1A is a block diagram of an oscillator 100 according to an exemplary embodiment of the inventive concept, and FIG. 1B is a circuit diagram of a complementary differential amplifier (CDA) 180 of the oscillator 100 of FIG. 1A.

Referring to FIG. 1A, the oscillator 100 may include a first CDA 110 and a second CDA 150.

The first CDA 110 and the second CDA 150 may complementarily amplify input pairs of differential signals and output the amplified signals. In other words, unlike a general differential amplifier, PMOS transistors and NMOS transistors are complementarily operated in the first CDA 110 and the second CDA 150 and thus input pairs of signals are differentially amplified. At least one of the first CDA 110 and the second CDA 150 may be a complementary fully differential amplifier. That is, PMOS transistors and NMOS transistors are complementarily operated in the first CDA 110 and the second CDA 150 and thus input pairs of signals are fully differentially amplified. In addition, a common mode range of the first CDA 110 and the second CDA 150 is greater than that of a general differential amplifier. The structures of the first CDA 110 and the second CDA 150 are illustrated in more detail in FIG. 1B.

Referring to FIG. 1B, the CDA 180 may include a plurality of transistors 181, 182, 191, 192, 193, and 194. The transistor 181 includes a first terminal to which a first voltage Vctrl is applied, and a gate connected to a node Nd. The transistor 191 includes a first terminal connected to a second terminal of the transistor 181, a second terminal connected to the node Nd, and a gate connected to a node Na. The transistor 192 includes a first terminal connected to the node Nd and a gate connected to the node Na. The transistor 193 includes a first terminal connected to the second terminal of the transistor 181, a second terminal connected to a node Nc, and a gate connected to a node Nb. The transistor 194 includes a first terminal connected to the node Nc and a gate connected to the node Nb. The transistor 182 includes a first terminal connected to a second terminal of the transistor 192 and a second terminal of the transistor 194, a second terminal to which a second voltage VSS is applied, and a gate connected to the node Nd.

The transistors 181, 191, and 193 may be PMOS transistors and the transistors 182, 192, and 194 may be NMOS transistors. In addition, the node Na and the node Nb may be input terminals of the CDA 180, and the node Nc may be an output terminal of the CDA 180.

Hereinafter, the oscillator 100 according to an exemplary embodiment is described with reference to FIG. 1A.

The first CDA 110 outputs a first output signal OUT obtained by amplifying signals input to a first input terminal and a second input terminal of the first CDA 110. The amplified version of the signal input to the second input terminal of the first CDA 110 is the first output signal, and the amplification of the signal input to the second input terminal of the first CDA 110 is controlled by the amplified version of the signal input to the first input terminal of the first CDA 110, for example. The second CDA 150 outputs a second output signal OUTB obtained by amplifying signals input to a first input terminal and a second input terminal of the second CDA 150. The second output signal OUTB is a signal having a differential phase with respect to the first output signal OUT. The amplified version of the signal input to the second input terminal of the second CDA 150 is the second output signal, and wherein the amplification of the signal input to the second input terminal of the second CDA 150 is controlled by the amplified version of the signal input to the first input terminal of the second CDA 150. An output terminal of the first CDA 110 is connected to the first and second input terminals of the second CDA 150 and an output terminal of the second CDA 150 is connected to the first and second input terminals of the first CDA 110. In other words, the output terminal of the second CDA 150, and the first and second input terminals of the of the first CDA 110 are connected to a first node N1, and the output terminal of the first CDA 110, and the first and second input terminals of the second CDA 150 are connected to a second node N2. The first CDA 110 and the second CDA 150 may have the same structures or the same amplification capabilities.

The structure of the oscillator 100 including the first CDA 110 and the second CDA 150 is described in more detail with reference to FIGS. 2 and 3.

Figure 2:
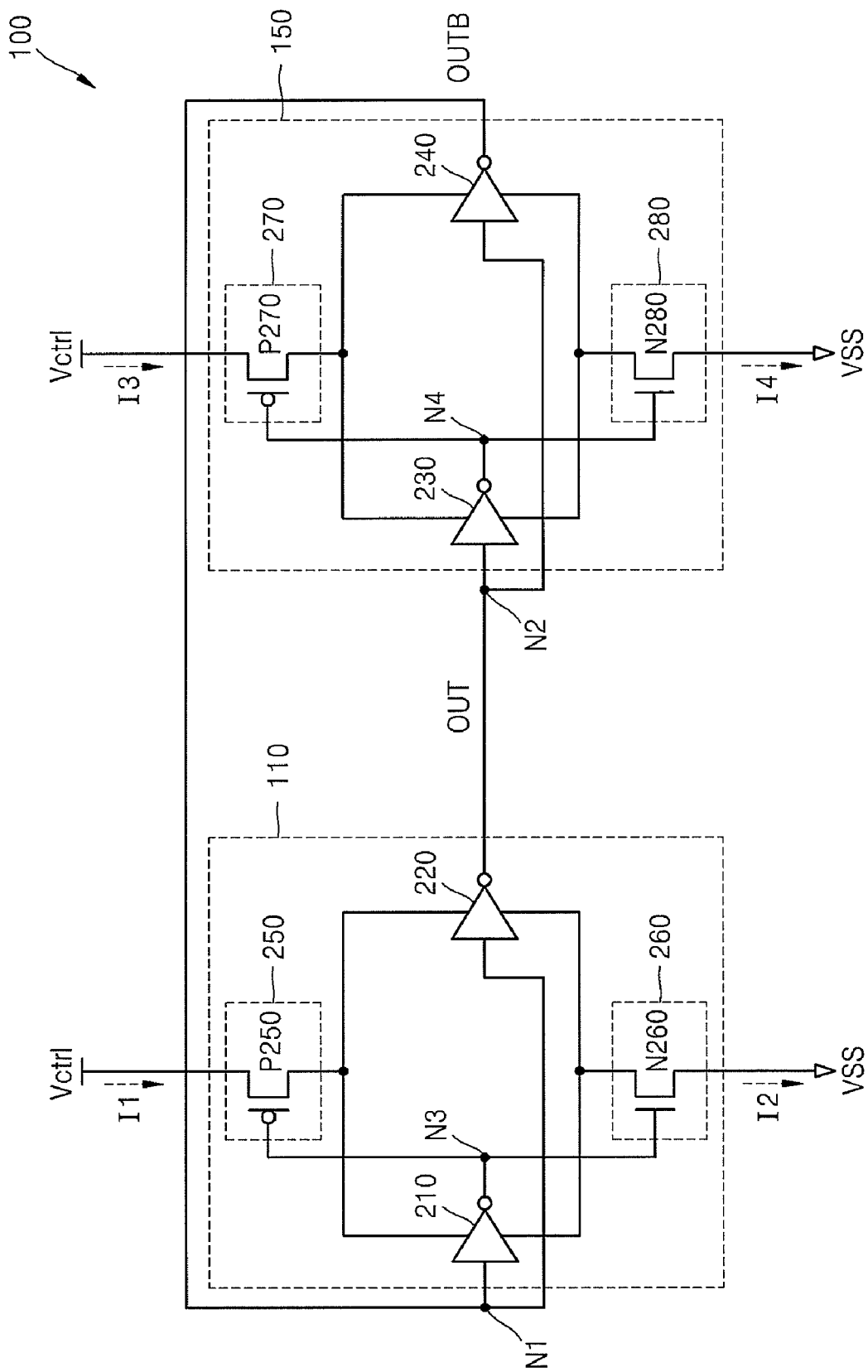
FIG. 2 is a block diagram illustrating circuits of CDAs of the oscillator of FIG. 1A.

FIG. 2 is a block diagram illustrating circuits of the first CDA 110 and the second CDA 150 of the oscillator 100 of FIG. 1A.

Referring to FIGS. 1A through 2, the first CDA 110 may include a first inverter 210, a second inverter 220, a first current supply controller 250, and a first current drain controller 260.

The first inverter 210 inverts the second output signal OUTB applied to the first node N1 and outputs the inverted second output signal OUTB to a third node N3. The second inverter 220 inverts the second output signal OUTB applied to the first node N1 and outputs the inverted second output signal OUTB to the second node N2 as the first output signal OUT.

The first current supply controller 250 selectively supplies a first current I1 to the first inverter 210 and the second inverter 220 in response to the output signal of the first inverter 210. The first current supply controller 250 may include a first switch which responds to the output signal of the first inverter 210 and connects or blocks the first voltage Vctrl to/from the first inverter 210 and the second inverter 220, thereby supplying or blocking the first current I1 to/from the first inverter 210 and the second inverter 220. In FIG. 2, the first switch is a PMOS transistor P250. In other words, the PMOS transistor P250 in FIG. 2 functions as a current source. However, the first switch according to the present exemplary embodiment is not limited to a PMOS transistor and may be another element which may determine whether to supply the first current I1 in response to the output signal of the first inverter 210.

The first current drain controller 260 selectively drains a second current I2 from the first inverter 210 and the second inverter 220 in response to the output signal of the first inverter 210. The first current drain controller 260 may include a second switch which responds to the output signal of the first inverter 210 and connects or blocks the second voltage VSS to/from the first inverter 210 and the second inverter 220, thereby selectively draining the second current I2 from the first inverter 210 and second inverter 220. In FIG. 2, the second switch is an NMOS transistor N260. In other words, the NMOS transistor N260 in FIG. 2 functions as a current sink. However, the second switch according to the present exemplary embodiment is not limited to an NMOS transistor and may be another element which may determine whether to drain the second current I2 in response to the output signal of the first inverter 210.

The second CDA 150 may have similar elements as the first CDA 110. For example, the second CDA 150 may include a third inverter 230, a fourth inverter 240, a second current supply controller 270, and a second current drain controller 280.

The third inverter 230 inverts the first output signal OUT applied to the second node N2 and outputs the inverted first output signal OUT to a fourth node N4. The fourth inverter 240 inverts the first output signal OUT applied to the second node N2 and outputs the inverted first output signal OUT to the first node Ni as the second output signal OUTB.

The second current supply controller 270 selectively supplies a third current I3 to the third inverter 230 and the fourth inverter 240 in response to the output signal of the third inverter 230. The second current supply controller 270 may include a third switch which responds to the output signal of the third inverter 230 and connects or blocks the first voltage Vctrl to/from the third inverter 230 and the fourth inverter 240, thereby supplying or blocking the third current I3 to/from the third inverter 230 and the fourth inverter 240. In FIG. 2, the third switch is a PMOS transistor P270. In other words, the PMOS transistor P270 in FIG. 2 functions as a current source, like the PMOS transistor P250. However, the third switch according to the present exemplary embodiment is not limited to a PMOS transistor and may be another element which may determine whether to supply the third current I3 in response to the output signal of the third inverter 230.

The second current drain controller 280 selectively drains a fourth current I4 from the third inverter 230 and the fourth inverter 240 in response to the output signal of the third inverter 230. The second current drain controller 280 may include a fourth switch which responds to the output signal of the third inverter 230 and connects or blocks the second voltage VSS to/from the third inverter 230 and the fourth inverter 240, thereby selectively draining the fourth current I4 from the third inverter 230 and the fourth inverter 240. In FIG. 2, the fourth switch is an NMOS transistor N280. In other words, the NMOS transistor N280 in FIG. 2 functions as a current sink, like the NMOS transistor N260. However, the fourth switch according to the present exemplary embodiment is not limited to an NMOS transistor and may be another element which may determine whether to drain the fourth current I4 in response to the output signal of the third inverter 230.

The first current supply controller 250 and the second current supply controller 270 may have the same structures or the same current supply capabilities. In addition, the first current drain controller 260 and the second current drain controller 280 may have the same structures or the same current drain capabilities. In addition, the first through fourth inverters 210, 220, 230, and 240 may have the same structures or the same device drive capabilities.

Figure 3:
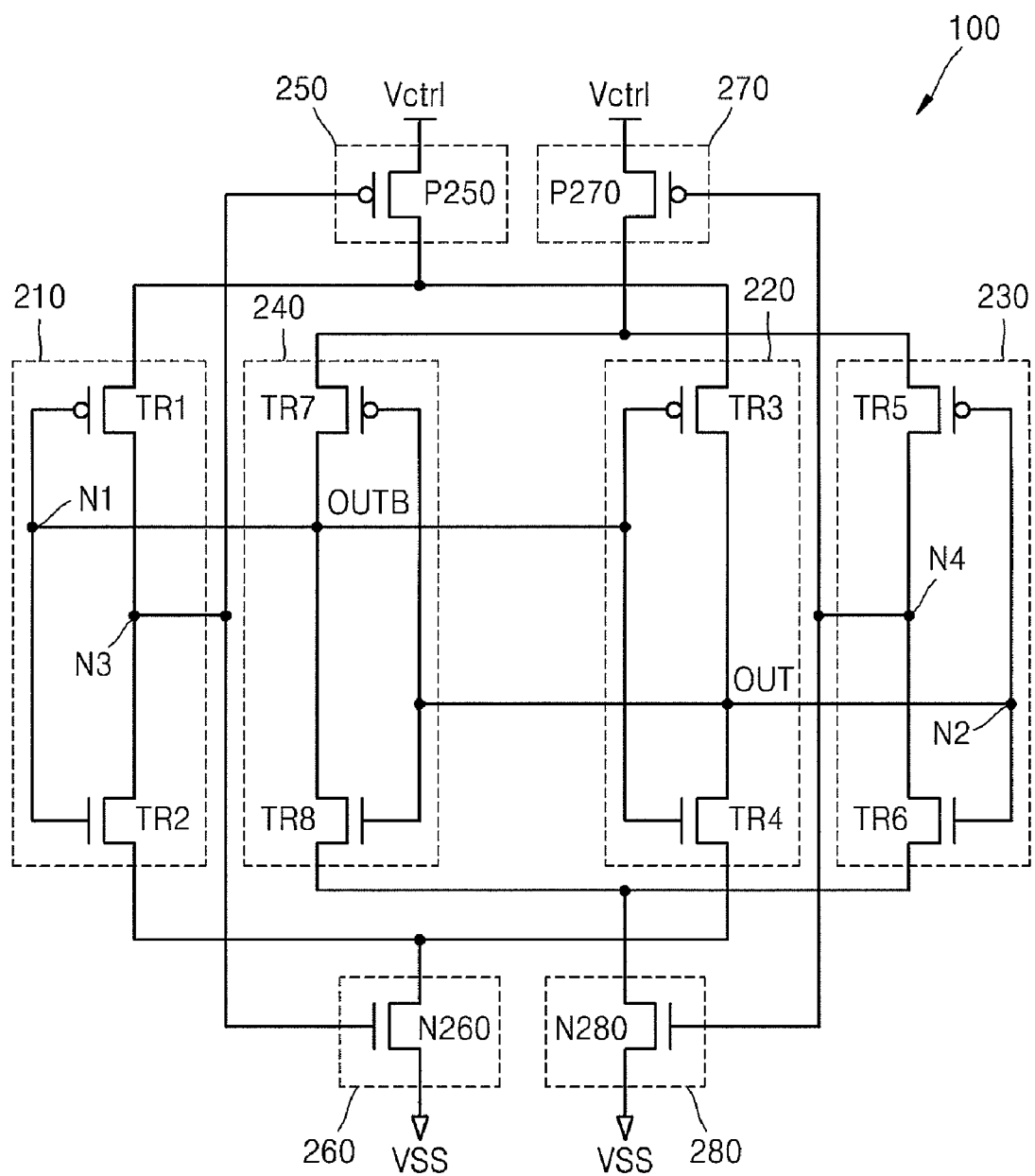
FIG. 3 is a circuit diagram of the oscillator of FIGS. 1A and 2.

FIG. 3 is a circuit diagram of the oscillator 100 of FIGS. 1A and 2. In FIG. 3, the first through fourth inverters 210, 220, 230, and 240 in FIG. 2 are illustrated as PMOS transistors and NMOS transistors, for example.

Referring to FIGS. 1A through 3, the first inverter 210 may include a first transistor TR1 and a second transistor TR2 which are connected to each other in series. The first transistor TR1 includes a first terminal connected to the first current supply controller P250, a second terminal connected to the third node N3, and a gate connected to the first node N1. The second transistor TR2 includes a first terminal connected to the third node N3, a second terminal connected to the first current drain controller N260, and a gate connected to the first node N1.

The second inverter 220 may include a third transistor TR3 and a fourth transistor TR4 which are connected to each other in series. The third transistor TR3 includes a first terminal connected to the first current supply controller P250, a second terminal connected to the second node N2, and a gate connected to the first node N1. The fourth transistor TR4 includes a first terminal connected to the second node N2, a second terminal connected to the first current drain controller N260, and a gate connected to the first node N1.

The third inverter 230 may include a fifth transistor TR5 and a sixth transistor TR6 which are connected to each other in series. The fifth transistor TR5 includes a first terminal connected to the second current supply controller P270, a second terminal connected to the fourth node N4, and a gate connected to the second node N2. The sixth transistor TR6 includes a first terminal connected to the fourth node N4, a second terminal connected to the second current drain controller N280, and a gate connected to the second node N2.

The fourth inverter 240 may include a seventh transistor TR7 and an eighth transistor TR8 which are connected to each other in series. The seventh transistor TR7 includes a first terminal connected to the second current supply controller P270, a second terminal connected to the first node Ni, and a gate connected to the second node N2. The eighth transistor TR8 includes a first terminal connected to the first node N1, a second terminal connected to the second current drain controller N280, and a gate connected to the second node N2.

In other words, as illustrated in FIGS. 1A through 3, the oscillator 100 according to the present exemplary embodiment includes the first CDA 110 and the second CDA 150 which are symmetrical to each other.

Hereinafter, the operation of the oscillator 100 will be described with reference to FIGS. 4A and 4B.

Figure 4A:
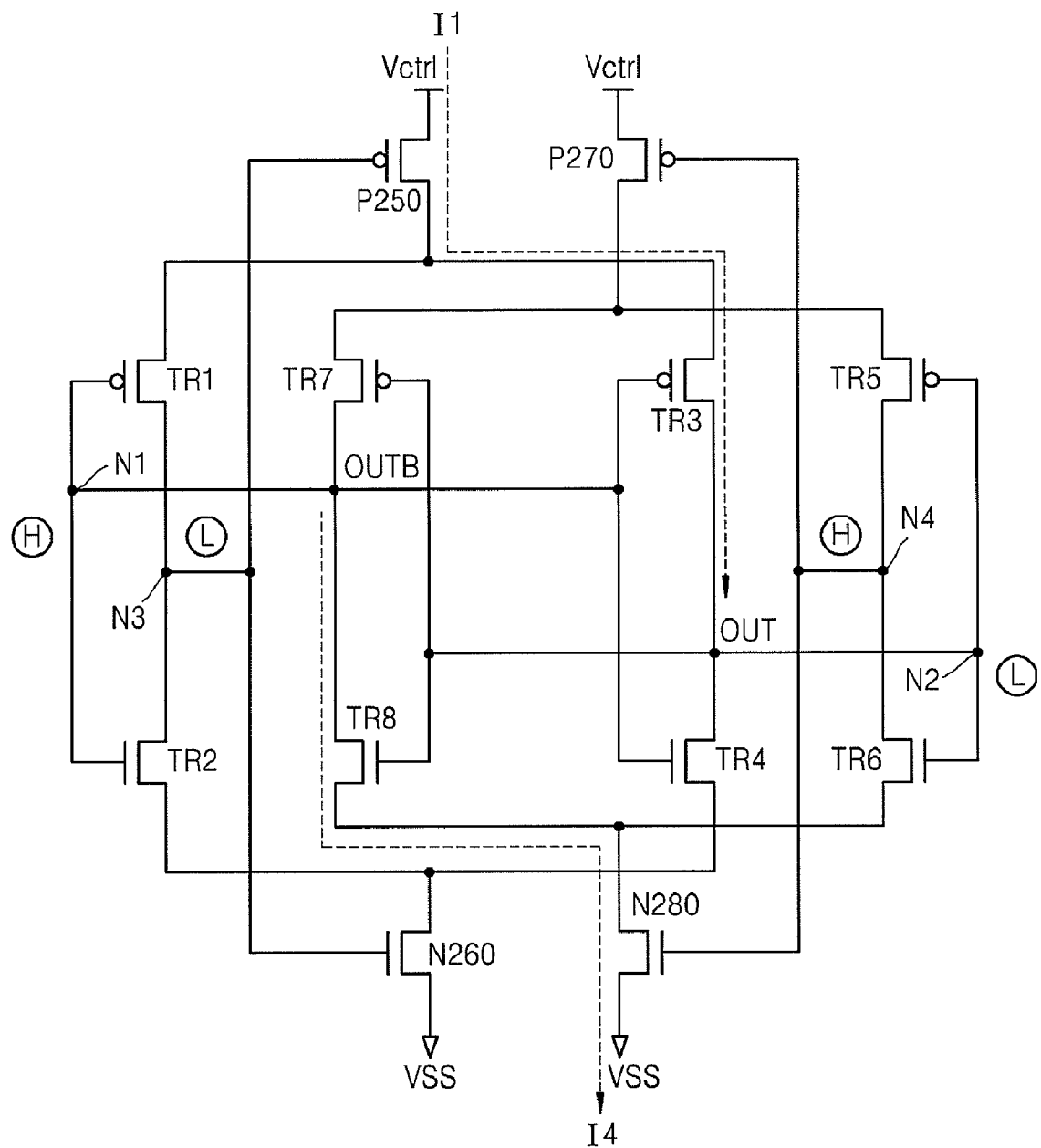
FIGS. 4A and 4B are circuit diagrams for explaining the operation of the oscillator of FIGS. 1A, 2, and 3.
Figure 4B:
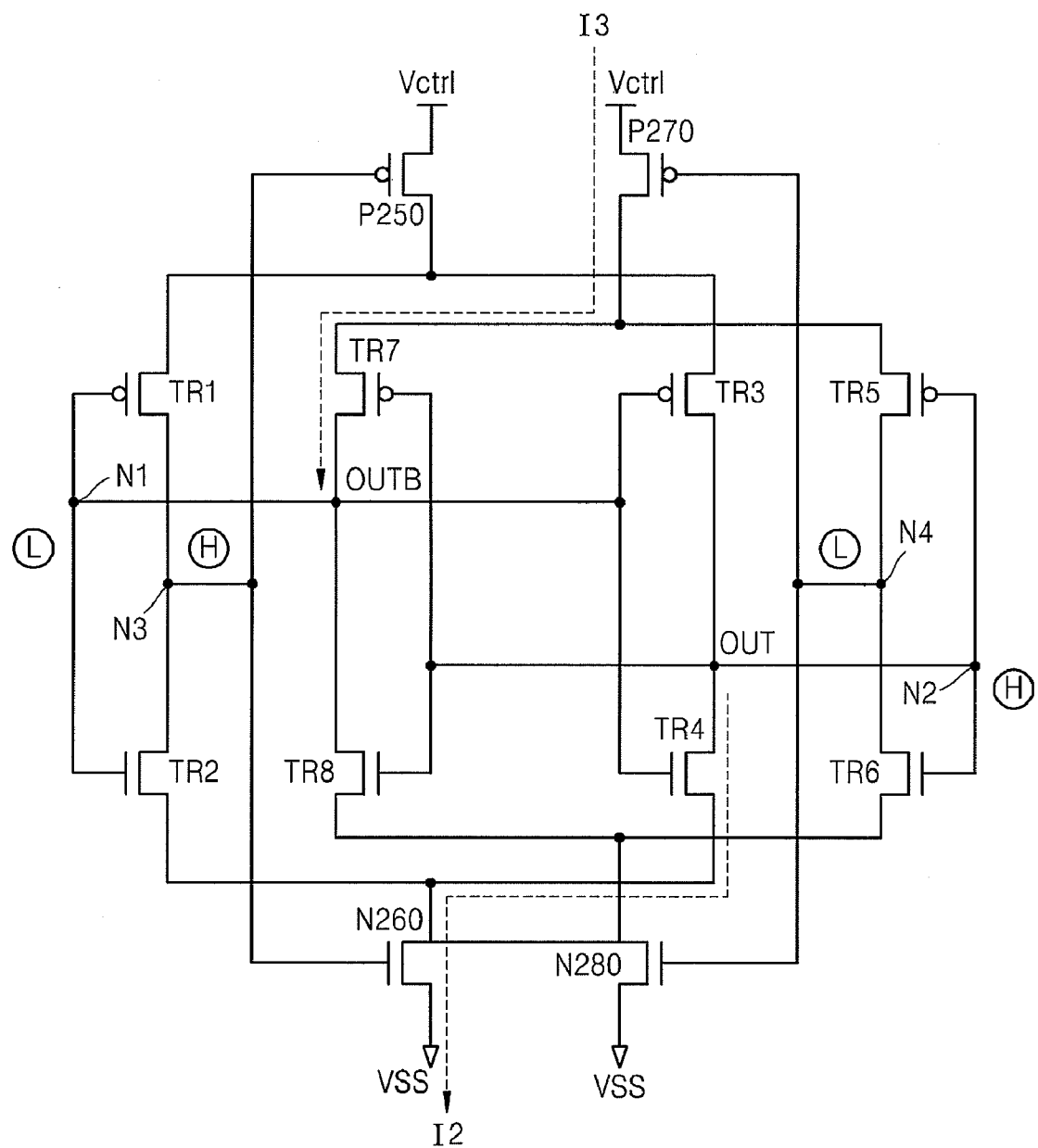

FIGS. 4A and 4B are circuit diagrams for explaining the operation of the oscillator 100 of FIGS. 1A, 2, and 3.

Referring to FIG. 4A, it is assumed in an initial stage that the first node N1 has a logic high level and the second node N2 has a logic low level. In this case, the third node N3 is at a logic low level so that the PMOS transistor P250 is turned on and the NMOS transistor N260 is turned off. Although the first node N1 is at a logic high level, a voltage level of the first node N1 is not high enough to turn off the third transistor TR3 and thus the third transistor TR3 remains turned on. Accordingly, the first current I1 flows from the first voltage Vctrl to the second node N2 through the PMOS transistor P250 and the third transistor TR3, both of which are turned on. Thus, a voltage level of the second node N2 increases.

In addition, the fourth node N4 is at a logic high level so that the PMOS transistor P270 is turned off and the NMOS transistor N280 is turned on. Although the second node N2 is at a logic low level, a voltage level of the second node N2 is not low enough to turn off the eighth transistor TR8 and thus the eighth transistor TR8 remains turned on. Accordingly, the fourth current I4 flows from the first node N1 to the second voltage VSS through the eighth transistor TR8 and the NMOS transistor N280, both of which are turned on. Thus, a voltage level of the first node Ni decreases.

According to the operation above, the voltage level of the first node N1 is transitioned from a logic high level to a logic low level and the voltage level of the second node N2 is transitioned from a logic low level to a logic high level.

When the voltage level of the first node N1 is transitioned to a logic low level and the voltage level of the second node N2 is transitioned to a logic high level, the operation of the oscillator 100 will be described with reference to FIG. 4B.

Referring to FIG. 4B, the first node N1 is transitioned to a logic low level and a second node N2 is transitioned to a logic high level. In this case, the third node N3 is at a logic high level so that the PMOS transistor P250 is turned off and the NMOS transistor N260 is turned on. Although the first node N1 is at a logic low level, a voltage level of the first node N1 is not low enough to turn off the fourth transistor TR4 and thus the fourth transistor TR4 remains turned on. Accordingly, the second current I2 flows from the second node N2 to the second voltage VSS through the fourth transistor TR4 and the NMOS transistor N260, both of which are turned on. Thus, the voltage level of the second node N2 decreases.

Then, the fourth node N4 is at a logic low level so that the PMOS transistor P270 is turned on and the NMOS transistor N280 is turned off. Although the second node N2 is at a logic high level, the voltage level of the second node N2 is not high enough to turn off the seventh transistor TR7 and thus the seventh transistor TR7 remains turned on. Accordingly, the third current I3 flows from the first voltage Vctrl to the first node N1 through the PMOS transistor P270 and the seventh transistor TR7, both of which are turned on. Thus, the voltage level of the first node N1 increases.

According to the operation above, the voltage level of the first node N1 is transitioned from a logic low level to a logic high level and the voltage level of the second node N2 is transitioned from a logic high level to a logic low level.

When the voltage level of the first node N1 is transitioned to a logic high level and the voltage level of the second node N2 is transitioned to a logic low level, the oscillator 100 operates as described in FIG. 4A. In other words, the oscillator 100 repeatedly performs the operation described with reference to FIG. 4A and the operation described with reference to FIG. 4B.

As described above, the voltage level of the first node Ni and the voltage level of the second node N2 are differential and oscillate between a logic high level and a logic low level.

The oscillator 100 of FIGS. 1A and 2 through 4B outputs the second output signal OUTB through the first node Ni and outputs the first output signal OUT through the second node N2. The first output signal OUT and the second output signal OUTB have a predetermined phase difference therebetween. Such a predetermined phase difference may be adjusted. For example, the phase difference between the first output signal OUT and the second output signal OUTB may be set to 180 degrees.

Figure 5:
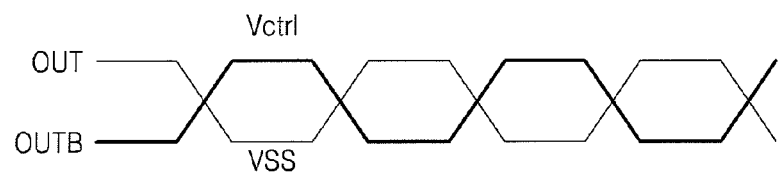
FIG. 5 illustrates clocks outputted by the oscillator of FIGS. 1A and 2 through 4B.

FIG. 5 illustrates clocks outputted by the oscillator 100 of FIG. 1A and 2 through 4B.

Referring to FIG. 5, the first output signal OUT of the second node N2 and the second output signal OUTB of the first node N1 each have different logic levels and oscillate.

Referring back to FIGS. 2 through 4B, as the voltage level of the fist voltage Vctrl is adjusted, an oscillating frequency of the first output signal OUT and the second output signal OUTB may be adjusted. In other words, since the voltage level of the fist voltage Vctrl is adjustable, the current quantity flowing in the PMOS transistors P250 and P270 may be adjusted and thereby the speed by which the voltage levels of the first node N1 and the second node N2 are transitioned may be adjusted. Accordingly, the oscillating frequencies of the first output signal OUT and the second output signal OUT may be adjusted.

Figure 6:
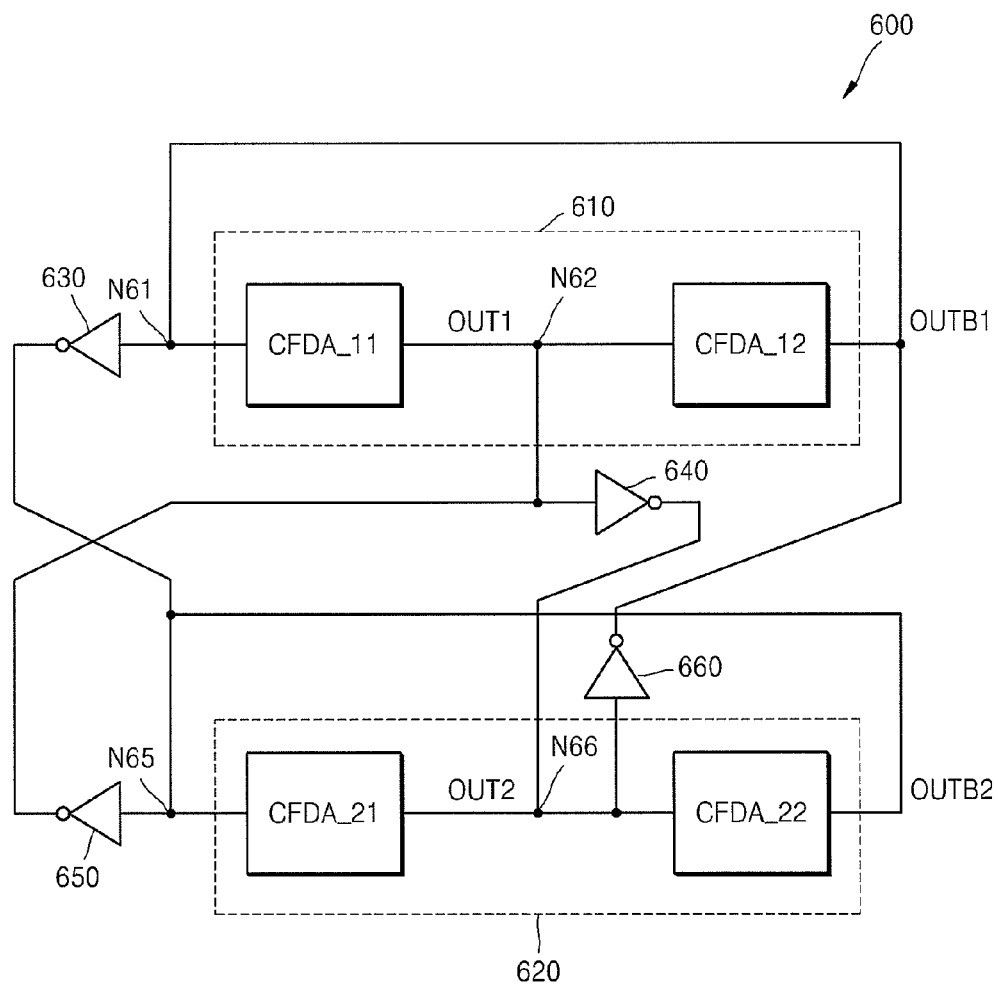
FIG. 6 is a block diagram of an oscillator according to an exemplary embodiment of the inventive concept.

FIG. 6 is a block diagram of an oscillator 600 according to an exemplary embodiment of the inventive concept.

Referring to FIG. 6, the oscillator 600 may include a plurality of first and second oscillator cells 610 and 620. In FIG. 6, the first and second oscillator cells 610 and 620 are illustrated for convenience of description, however three or more oscillator cells may be connected and used.

Each of the first and second oscillator cells 610 and 620 may be the oscillator 100 of FIGS. 1A, 2, and 3.

Referring to FIG. 6, the first oscillator cell 610 and the second oscillator cell 620 are connected using direct-coupling and cross-coupling. In other words, a first auxiliary inverter 630 of the first oscillator cell 610 is connected to a first node N65 of the second oscillator cell 620 using direct-coupling and a first auxiliary inverter 650 of the second oscillator cell 620 is connected to a second node N62 of the first oscillator cell 610 using cross-coupling. In addition, a second auxiliary inverter 640 of the first oscillator cell 610 is connected to a second node N66 of the second oscillator cell 620 using direct-coupling, and a second auxiliary inverter 660 of the second oscillator cell 620 is connected to a first node N61 of the first oscillator cell 610 using cross-coupling.

Accordingly, the first oscillator cell 610 is controlled by the second oscillator cell 620, and the second oscillator cell 620 is controlled by the first oscillator cell 610.

Figure 7:
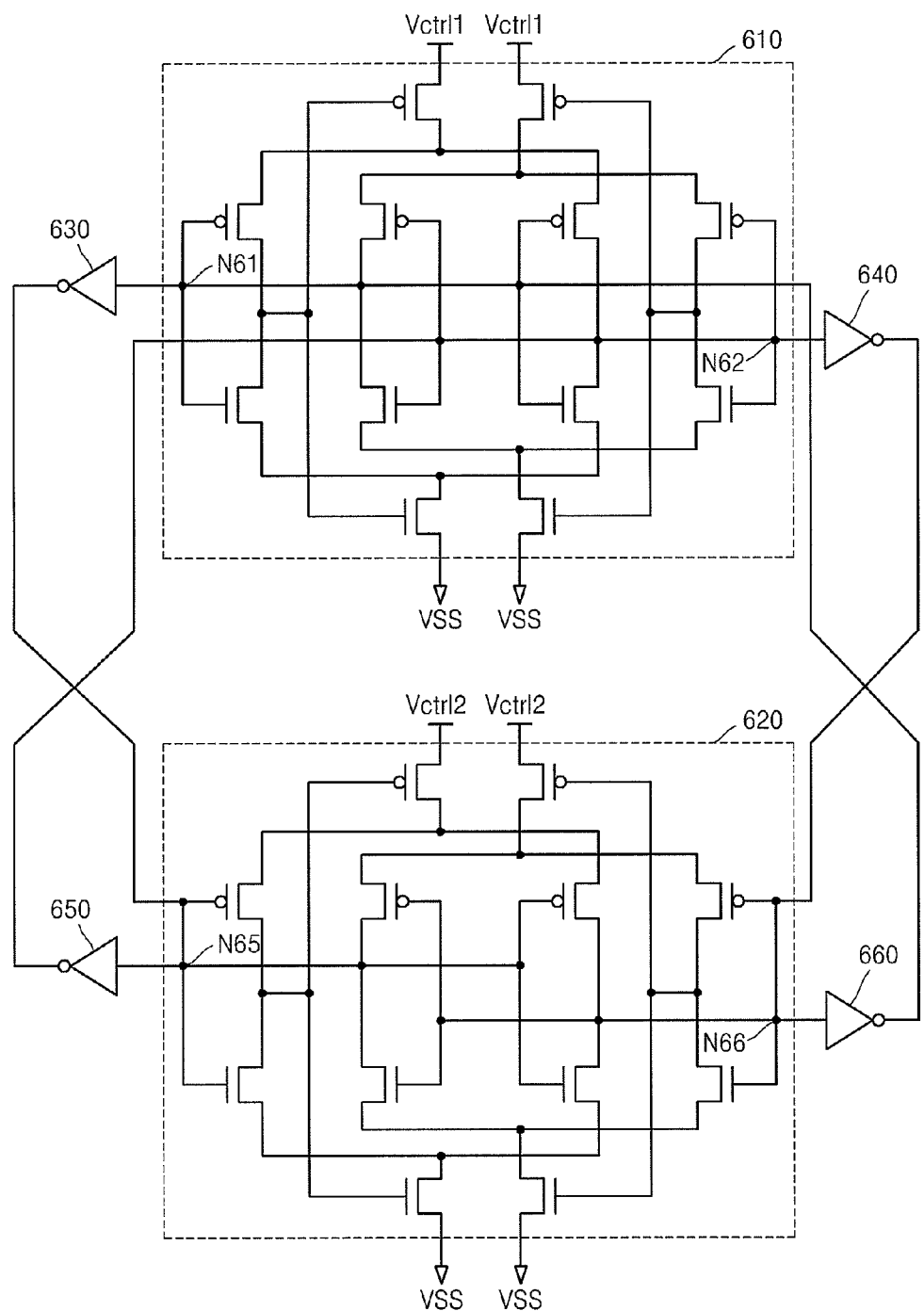
FIG. 7 is a circuit diagram of the oscillator of FIG. 6.

FIG. 7 is a circuit diagram of the oscillator 600 of FIG. 6.

In FIG. 7, each of the first and second oscillator cells 610 and 620 is the oscillator 100 of FIG. 3.

Referring to FIG. 7, a first control voltage Vctrl1 may be applied to the first oscillator cell 610 and a second control voltage Vctrl2 may be applied to the second oscillator cell 620.

In other words, as the amount of the first control voltage Vctrl1 applied to the first oscillator cell 610 and the amount of the second control voltage Vctrl2 applied to the second oscillator cell 620 are changed, phase differences between output signals OUT1 and OUTB1 of the first oscillator cell 610 and output signals OUT2 and OUTB2 of the second oscillator cell 620 may be respectively 30, 45, 60, 90, and 120 degrees. In other words, the oscillator 600 controls the first control voltage Vctrl1 and the second control voltage Vctrl2 and changes the phase difference between the output signals OUT1 and OUTB1 of the first oscillator cell 610 and the output signals OUT2 and OUTB2 of the second oscillator cell 620.

When the amounts of the first control voltage Vctrl1 and the second control voltage Vctrl2 are the same, the phase difference between the output signals OUT1 and OUTB1 of the first oscillator cell 610 and the output signals OUT2 and OUTB2 of the second oscillator cell 620 is 90 degrees and the oscillator 600 of FIG. 7, which outputs differential signals, may be a quadrature differential oscillator.

As described above, when the amounts of the first control voltage Vctrl1 and the second control voltage Vctrl2 are the same, the phase difference between the output signals of the oscillator 600 may be changed according to the number of oscillator cells. In other words, when the number of oscillator cells is changed to 3, 4, and 5, the phase difference between the output signals is changed. In FIGS. 6 and 7, the first and second oscillator cells 610 and 620 are included. Thus, when the capacities of the first control voltage Vctrl1 and the second control voltage Vctrl2 are the same, the output signals of the oscillator 600 have a phase difference of 90 degrees. For example, when the oscillator 600 has four oscillator cells and control voltages of the oscillator cells are respectively constant, the oscillator 600 may generate output signals having a phase difference of 45 degrees.

Figure 8:
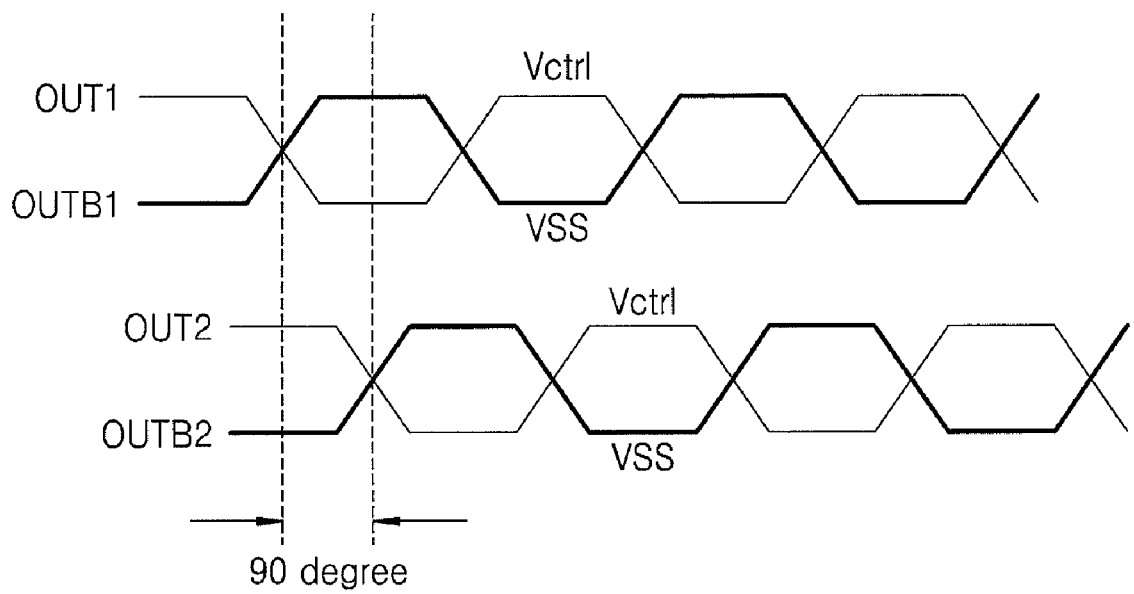
FIG. 8 illustrates clocks outputted by the oscillator of FIGS. 6 and 7.

FIG. 8 illustrates clocks outputted by the oscillator 600 of FIGS. 6 and 7.

Referring to FIG. 8, the output signals OUT1 and OUTB1 of the first oscillator cell 610 and the output signals OUT2 and OUTB2 of the second oscillator cell 620 have a phase difference of 90 degrees.

In other words, the oscillator 600 illustrated in FIGS. 6 and 7 may generate output signals having a phase difference of 90 degrees or output signals having phase differences of different degrees without a separate pull-swing converter or a divider. In addition, the oscillator 600 has a symmetrical structure.

Figure 9:
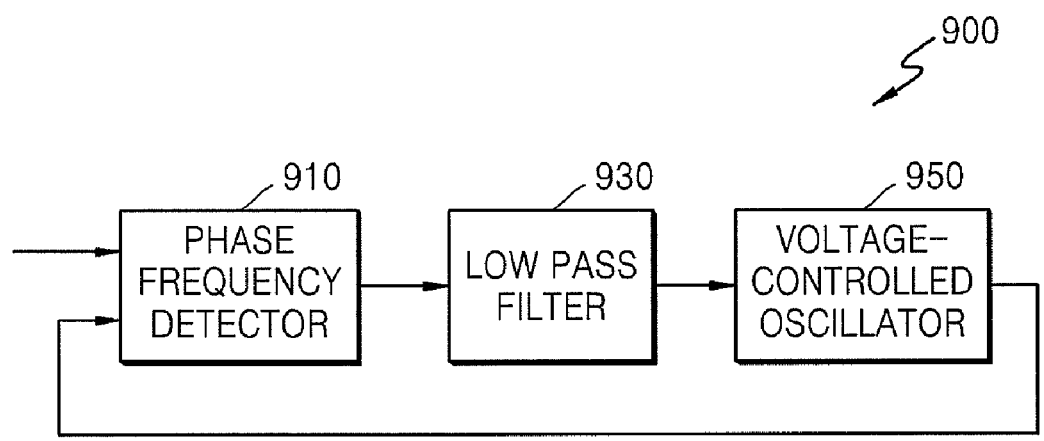
FIG. 9 is a block diagram of a phase locked loop (PLL) including an oscillator according to an exemplary embodiment of the inventive concept.

FIG. 9 is a block diagram of a phase locked loop (PLL) 900 including an oscillator according to an exemplary embodiment of the inventive concept.

Referring to FIG. 9, the PLL 900 may include a phase frequency detector 910, a low pass filter 930, and a voltage-controlled oscillator (VCO) 950. The VCO 950 may include the oscillator 100 or 600 described above with reference to FIGS. 1A through 8.

Figure 10:
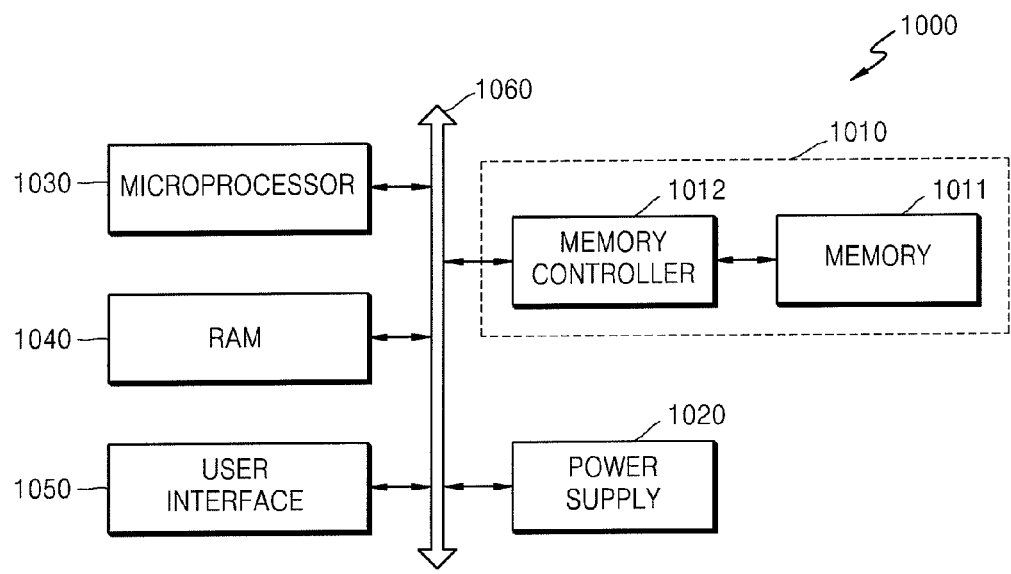
FIG. 10 is a block diagram of a computing system device including a semiconductor device according to an exemplary embodiment of the inventive concept.

FIG. 10 is a block diagram of a computing system device 1000 including a semiconductor device according to an exemplary embodiment of the inventive concept.

Referring to FIG. 10, the computing system device 1000 may include a microprocessor 1030 electrically connected to a bus 1060, a user interface 1050, and a memory system device 1010 including a memory controller 1012 and a memory device 1011. The memory controller 1012 may include the oscillator 100 or 600 described above with reference to FIGS. 1A through 8 or the PLL 900 of FIG. 9. In other words, the memory controller 1012 may control the memory device 1011 using the oscillator 100 or 600 or an output signal of the PLL 900. The computing system device 1000 may further include a random access memory (RAM) 1040 and a power supply device 1020.

When the computing system device 1000 is a mobile device, a battery for supplying an operating voltage and a modem such as a baseband chipset may be additionally provided. In addition, an application chipset, a camera image processor (CIS), and a mobile dynamic random access memory (DRAM) may be included in the computing system device 1000.

The memory controller 1012 and the memory device 1011 may form, for example, a solid-state drive/disk (SSD), which uses a non-volatile memory to store data.

Figure 11:
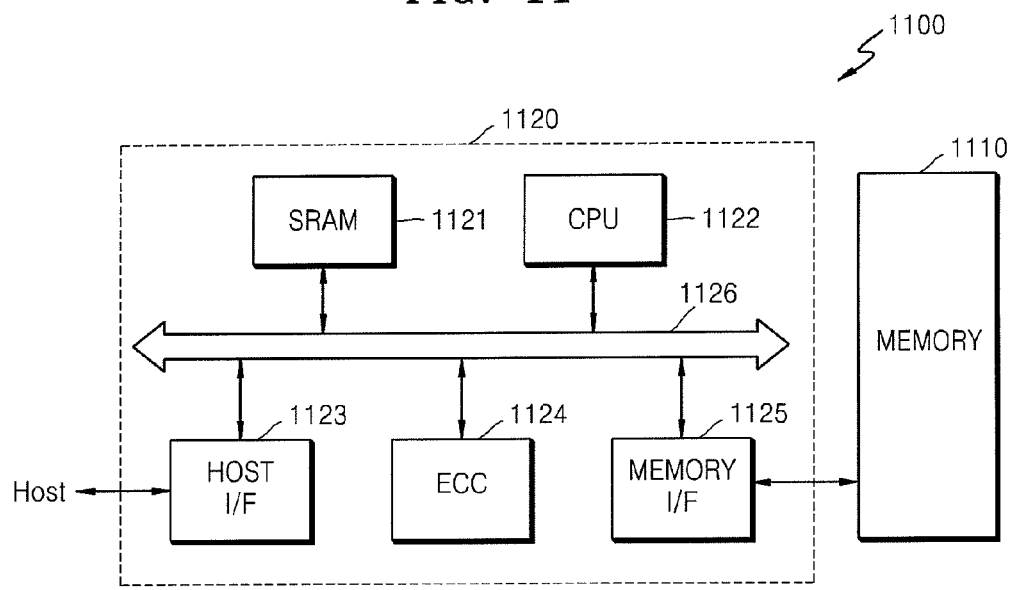
FIG. 11 is a block diagram of a memory card including a semiconductor device according to an exemplary embodiment of the inventive concept.

FIG. 11 is a block diagram of a memory card 1100 including a semiconductor device according to an exemplary embodiment of the inventive concept.

Referring to FIG. 11, the memory card 1100 may include a memory device 1110 and a memory controller 1120. The memory controller 1120 may include the oscillator 100 or 600 described above with reference to FIGS. 1A through 8 and the PLL 900 of FIG. 9. In other words, the memory controller 1120 may control the memory device 1110 using the oscillator 100 or 600 or an output signal of the PLL 900. The memory controller 1120 may communicate with the outside (for example, a host) through one of various interface protocols such as universal serial bus (USB), multi media card (MMC), peripheral component interconnect-express (PCI-E), serial advanced technology attachment (SATA), parallel advanced technology attachment (PATA), small computer system interface (SCSI), enhanced small disk interface (ESDI), and integrated drive electronics (IDE). The memory controller 1120 includes a central processing unit (CPU) 1122, a static random access memory (SRAM) 1121, a host interface (I/F) 1123, an error correction code (ECC) 1124, a memory I/F 1125, and a bus 1126.

The memory device 1110 may be mounted on the memory card 1100 using various forms of packages. Examples of the packages may include package on package (PoP), ball grid arrays (BGAs), chip scale packages (CSPs), plastic leaded chip carrier (PLCC), plastic dual inline package (PDIP), die in waffle pack, die in wafer form, chip on board (COB), ceramic dual in-line package (CERDIP), plastic metric quad flat pack (MQFP), thin quad flat pack (TQFP), small outline integrated circuit (SOIC), shrink small outline package (SSOP), thin small outline (TSOP), system in package (SIP), multi chip package (MCP), wafer-level fabricated package (WFP), and wafer-level processed stack package (WSP).

While the inventive concept has been particularly shown and described with reference to exemplary embodiments thereof, it will be understood by those of ordinary skill in the art that various changes in form and details may be made therein without departing from the spirit and scope of the inventive concept as defined by the following claims.

What is claimed is:

1. A differential amplifier (DA), comprising:
a first inverter;
a second inverter;
a current supply controller; and
a current drain controller,
wherein the first inverter inverts a first input signal applied to the first inverter and outputs the inverted first input signal to the current supply controller and the current drain controller,
wherein second inverter inverts the first input signal applied to the second inverter and outputs the inverted first input signal as an output signal of the DA,
wherein the current supply controller supplies current to the first and second inverters in response to the inverted first input signal output from the first inverter during a first period,
wherein the current drain controller drains current from the first and second inverters in response to the inverted first input signal output from the first inverter during a second period, and
wherein the output signal of the DA and the first input signal have differential phases with respect to each other and oscillate between logic high and low levels during the first period and the second period.

2. The DA of claim 1, wherein an oscillation frequency is adjusted by a control voltage applied to the DA.

3. The DA of claim 1, wherein the current supply controller and the current drain controller comprise a PMOS and NMOS transistor, respectively.

4. The DA of claim 1, wherein the first inverter comprises a PMOS and NMOS transistor and the second inverter comprises a PMOS and NMOS transistor.

5. The DA of claim 1, wherein the output of the DA is an input signal to another DA having the same structure as the original DA, and wherein the first input signal of the original DA is an output signal of the another DA.

6. The DA of claim 1, wherein the current supply controller does not supply current to the first and second inverters in response to the inverted first input signal output from the first inverter during the second period and the current drain controller does not drain current from the first and second inverters in response to the inverted first input signal output from the first inverter during the first period.

7. The DA of claim 1, wherein the DA is a fully differential amplifier.

* * * * *